(12) United States Patent
Choi et al.

(10) Patent No.: US 9,645,202 B2
(45) Date of Patent: May 9, 2017

(54) GEOMAGNETIC SENSOR CALIBRATION APPARATUS AND METHOD THEREOF

(71) Applicant: SAMSUNG ELECTRONICS CO., LTD., Suwon-si (KR)

(72) Inventors: Eun-seok Choi, Anyang-si (KR); Ho-june Yoo, Seoul (KR); Sang-on Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 695 days.

(21) Appl. No.: 14/133,961

(22) Filed: Dec. 19, 2013

(65) Prior Publication Data

US 2014/0200841 A1   Jul. 17, 2014

(30) Foreign Application Priority Data

Jan. 17, 2013   (KR) ........................ 10-2013-0005503

(51) Int. Cl.
  *G01N 31/00*  (2006.01)
  *G01R 33/04*  (2006.01)
(52) U.S. Cl.
  CPC .................................. *G01R 33/04* (2013.01)

(58) Field of Classification Search
  CPC .... G06K 19/06037; G06K 1/121; G06K 7/14; G06K 7/1417; G06K 9/00342; G06K 2009/00738; G06K 2209/05; G06K 9/00711; G06K 9/00724; G06K 9/00751; G06K 9/32; G01C 21/16; G01C 17/38; G01C 21/165
  See application file for complete search history.

(56) References Cited

U.S. PATENT DOCUMENTS

2013/0060470 A1\*  3/2013  Handa ................... G01C 17/38
                                                            702/2

\* cited by examiner

*Primary Examiner* — Roy Y Yi
(74) *Attorney, Agent, or Firm* — Sughrue Mion, PLLC

(57) ABSTRACT

A geomagnetic sensor calibration apparatus includes a geomagnetic sensor which measures at least one value of Earth's magnetic field, an initial point estimator which estimates first central points regarding the at least one value of the Earth's magnetic field by using a first linear function, a central point estimator which estimates second central points by using a second linear function and the estimated first central points, and a controller which determines whether calibrating of the geomagnetic sensor is necessary based on the estimated first central points and controls the central point estimator to estimate second central points based on whether calibration is determined to be necessary.

17 Claims, 7 Drawing Sheets

GEOMAGNETIC SENSOR CALIBRATION APPARATUS AND METHOD THEREOF

CROSS-REFERENCE TO RELATED APPLICATIONS

This application claims priority from Korean Patent Application No. 10-2013-0005503, filed on Jan. 17, 2013 in the Korean Intellectual Property Office, the disclosure of which is incorporated herein by reference in its entirety.

BACKGROUND

1. Field of the Invention

Apparatuses and methods consistent with exemplary embodiments relate to a geomagnetic sensor which measures the magnitude and direction of the Earth's magnetic field, and more specifically, to a geomagnetic sensor calibration apparatus and method which correct errors of geomagnetic sensors.

2. Description of the Related Art

Various types of electronic devices including devices having global positioning system (GPS) functions and compass functions have been developed and supplied with the development of electronic technologies. In order to perform these functions, a process of calculating azimuth is required. Gyro sensors or geomagnetic sensors are widely used to calculate azimuth. For example, gyroscopes and geomagnetic sensors are mounted on electronic devices, such as smart phones or tablet personal computers (PCs) and perform various services or functions including sensing user movements and estimating direction of devices.

A gyroscope sensor calculates rotating angular velocity by calculating Coriolis force. When a gyroscope is used, velocity is calculated by measuring and integrating accelerations, and displacement information is obtained by double integrating the calculated velocity.

A geomagnetic sensor measures the geomagnetic field with a method of measuring voltage values induced by the geomagnetic field by using a fluxgate of other device. The geomagnetic sensor may be implemented with two axes or three axes. Because output values calculated from each axis of the geomagnetic sensor vary according to the magnitude of surrounding geomagnetic fields, normalization, in which output values of the geomagnetic sensor are mapped within a preset range, for example, from −1 to 1, may be performed. Normalization is performed by using normalizing factors, such as scale values or offset values. To calculate normalizing factors, output values are calculated while rotating the geomagnetic sensor several times, and maximum and minimum values are detected among the output values. Values normalized by using normalizing factors are utilized in calibrating azimuth.

However, offset values among normalizing factors are often distorted due to influences of surrounding environment factors which affect magnetism. FIG. 1 is an illustration which simplifies and expresses magnetic distortion on dimensional coordinates.

There are soft iron effects and hard iron effects for magnetic distortion which influence the geomagnetic sensor. Effects by soft iron change the scale of sensor values and effects by hard iron influence the offset of sensor values. Because effects by soft iron are usually minimal, to calibrate errors of the geomagnetic sensor effects by hard iron are discussed.

For example, when the geomagnetic sensor is mounted within mobile electronic devices, such as cellular phones, offset values may be changed when substituting a battery or closing and opening LCD folder. Offset values may also be changed when turbulent material, such as objects with strong magnetic properties or steel structures are placed near the geomagnetic sensor. When normalization is performed by using distorted offset values, normalized values are distorted. Therefore, finally calculated azimuth includes errors.

FIG. 2 is a diagram which illustrates effects by hard iron on three-dimensional coordinates of X, Y, and Z.

Korean Patent No. 10-0831373 discloses that a geomagnetic sensor is calibrated by using offset values, average values, and standard deviation values so as to account for errors caused by effects of hard iron in sensed values of the geomagnetic sensor.

According to KR 10-0831373, a three-axis geomagnetic sensor calculates output values corresponding to surrounding magnetics by using a fluxgate of X, Y, and Z axes that are orthogonally crossed. The output values from the three-axis geomagnetic sensor are normalized by mapping each of output values in the fluxgate of X, Y, and Z axes within a preset range, for example, from −1 to 1. Offset values and scale values used in normalization are previously established and stored in an internal memory.

Distance ($r_e$) between output values (X, Y, Z) of the three-axis geomagnetic sensor and preset offset values ($X_{OP}$, $Y_{OP}$, $Z_{OP}$) can be expressed with the following mathematical formula:

$$r_p = \sqrt{(X-X_{0p})^2+(Y-Y_{0p})^2+(Z-Z_{0p})^2} \qquad \text{[Formula 1]}$$

According to Formula 1, when distance ($r_p$) is greater than allowable range ($\alpha$), it is determined that the geomagnetic values are distorted and calibration is performed. The above offset values are central points of a sphere which indicate critical error values calculated statistically. The allowable range can be established with various values, such as 1 or 1±0.1 according to the area in which the electronic device having the three-axis geomagnetic sensor is used or according to the use objectives of electronic devices.

When distortion is determined to occur, sampling sensed geomagnetic values is performed to calibrate errors. Sampling is randomly performed whenever the geomagnetic sensor device moves within preset time. KR 10-0831373 suggests a method of keeping a distance between respective sampled values to be more than a preset distance. In other words, KR10-0831373 selects sampled values only out of critical distance.

After sampling, the mean (mean($r_p$)) and standard deviation (std($r_p$)) of distances ($r_p$) between output values (X, Y, Z) to be sampled in the geomagnetic sensor and the above offset values are calculated. If any one of the mean (mean ($r_p$)) and the standard deviation (std($r_p$)) is greater than a preset value, it is determined that distortion has occurred.

In order to calibrate the three-axis geomagnetic sensor, a three-dimensional sphere which has central points ($X_0$, $Y_0$, $Z_0$) and radius (r) can be modeled according to the following mathematical formula:

$$(X-X_0)^2+(Y-Y_0)^2+(Z-Z_0)^2 r^2 \qquad \text{[Formula 2]}$$

The least square method is used to calculate central points ($X_0$, $Y_0$, $Z_0$) from values of the three-axis geomagnetic sensor. Preset offset values ($X_{OP}$, $Y_{OP}$, $Z_{OP}$) are established as initial values of central points ($X_0$, $Y_0$, $Z_0$), and radius (r) is a constant value established as the radius of a magnetic sphere based on preset offset values ($X_0$, $Y_0$, $Z_0$). The central points are estimated with a Gauss-Newton algorithm.

However, the method of calibrating a geomagnetic sensor proposed by KR 10-0831373 lacks preciseness in estimating central points because the initial values established based on specific conditions, and used in the calibration calculations, are fixed. Therefore, a method of calibrating a geomagnetic sensor more precisely is necessary.

SUMMARY

Exemplary embodiments address the above disadvantages and other disadvantages not described above. Also, the exemplary embodiments are not required to overcome the disadvantages described above, and an exemplary embodiment may not overcome any of the problems described above.

One or more exemplary embodiments provide a geomagnetic sensor calibration apparatus and method which can perform precise error calibration by estimating initial central points of a sphere which models sensed geomagnetic values by using linear functions and estimating final central points by using the estimated initial central points.

According to an aspect of an exemplary embodiment, there is provided a geomagnetic sensor calibration apparatus including a geomagnetic sensor configured to measure at least one value of Earth's magnetic field, an initial value estimator configured to estimate first central points from the at least one measured value of the Earth's magnetic field by using a first linear function, a central point estimator configured to estimate second central points by using a second linear function and the estimated first central points, and a controller configured to determine whether calibration of the geomagnetic sensor is necessary based on the estimated first central points, and control the central point estimator to estimate second central points based on a result of the determination.

The at least one value of the Earth's magnetic field may be expressed with coordinates in an X, Y, and Z axes of dimensional coordinates.

The first linear function may linearize a function:

$$f = r_i^2 - r^2,$$

wherein $$r_i = \sqrt{(X_i - X_0)^2 + (Y_i - Y_0)^2 + (Z_i - Z_0)^2},$$

$$(X - X_0)^2 + (Y - Y_0)^2 + (Z - Z_0)^2 = r^2,$$

$(X_i, Y_i, Z_i)$ are coordinate values which are sampled at an i-th number of the geomagnetic sensor, $(X_0, Y_0, Z_0)$ are the estimated first central points, n is a predetermined integer, and $1 \leq i \leq n$.

Further, the second linear function may linearize a minimized function:

$$d_i = r_i - r_0,$$

wherein $$r_i = \sqrt{(X_i - X_0)^2 + (Y_i - Y_0)^2 + (Z_i - Z_0)^2},$$

$(X_i, Y_i, Z_i)$ are coordinate values which are sampled at an i-th number of the geomagnetic sensor, $(X_0, Y_0, Z_0)$ are the estimated first central points, $r_0$ is a radius of a sphere having the estimated first central points, n is a predetermined integer, and $1 \leq i \leq n$.

Further, the first linear function may linearize a minimized function:

$$d_i = r_i - \bar{r},$$

wherein $$r_i = \sqrt{(X_i - X_0)^2 + (Y_i - Y_0)^2 + (Z_i - Z_0)^2},$$

$(X_i, Y_i, Z_i)$ are coordinate values which are sampled at an i-th number of the geomagnetic sensor, $(X_0, Y_0, Z_0)$ are the estimated first central points, $\bar{r}$ is a constant value indicating a radius of a sphere having the estimated first central points, n is a predetermined integer, and $1 \leq i \leq n$.

The controller may be further configured to calibrate central points by using a following formula:

$$\hat{M}_b = M_b - M_0 = \begin{bmatrix} X - X_0 \\ Y - Y_0 \\ Z - Z_0 \end{bmatrix},$$

wherein $M_0 = [X_0, Y_0, Z_0]^T$ are coordinate values indicating central points estimated by the central point estimator, and $M_b = [X, Y, Z]^T$ are output values of the geomagnetic sensor.

The controller may be further configured to calculate a mean value and a standard deviation value of distances between a plurality of sampling coordinates output from the geomagnetic sensor and the estimated first central points, and determine that calibrating is necessary based on whether at least one of the calculated average value and standard deviation value exceeds a preset value.

The geomagnetic sensor may include a fluxgate of X, Y, and Z axes which are arranged orthogonally to each other, a driving signal generator configured to provide driving signals to the fluxgate of X, Y, and Z axes, a signal processor configured to, when the fluxgate of X, Y, and Z axes is driven by the driving signals and outputs electrical signals corresponding to a surrounding magnetic field, convert the electrical signals to digital signals and output the digital signals, and a geomagnetic sensor controller configured to perform normalization to map output values of the signal processor within a certain range by using offset values and preset scale values, and output normalized three-axis output values.

The controller may be further configured to calculate a pitch angle and a roll angle of the geomagnetic sensor calibration apparatus, and calculate azimuth by using the at least one measured value of the Earth's magnetic field, the pitch angle, and the roll angle.

According to an aspect of another exemplary embodiment, there is provided a geomagnetic sensor calibration method including measuring at least one value of Earth's magnetic field, estimating first central points from the at least one measured value of the Earth's magnetic field by using a first linear function, and estimating second central points by using a second linear function and the estimated first central points.

The values of the at least one measure value of the Earth's magnetic field may be expressed with coordinates in a X, Y, and Z coordinate space.

Further, the first linear function may linearize a function:

$$f = r_i^2 - r^2.$$

wherein $$r_i = \sqrt{(X_i - X_0)^2 + (Y_i - Y_0)^2 + (Z_i - Z_0)^2},$$

$$(X - X_0)^2 + (Y - Y_0)^2 + (Z - Z_0)^2 = r^2,$$

$(X_i, Y_i, Z_i)$ are coordinate values which are sampled at an i-th number of the geomagnetic sensor,
$(X_0, Y_0, Z_0)$ are the first estimated central points,
n is a predetermined integer, and
$1 \leq i \leq n$.

Further, the second linear function may linearize a minimized function:

$$d_i = r_i - r_0,$$

wherein $$r_i \sqrt{(X_i - X_0)^2 + (Y_i - Y_0)^2 + (Z_i - Z_0)^2},$$

$(X_i, Y_i, Z_i)$ are coordinate values which are sampled at an i-th number of the geomagnetic sensor,
$(X_0, Y_0, Z_0)$ are the first estimated central points,
$r_0$ is a radius of a sphere having the estimated first central points,
n is a predetermined integer, and
$1 \leq i \leq n$.

Further, the first linear function may linearize the minimized function:

$$d_i = r_i - \bar{r},$$

wherein $$r_i = \sqrt{(X_i - X_0)^2 + (Y_i - Y_0)^2 + (Z_i - Z_0)^2},$$

$(X_i, Y_i, Z_i)$ are coordinate values which are sampled at an i-th number of the geomagnetic sensor,
$(X_0, Y_0, Z_0)$ are the first estimated central points,
$\bar{r}$ is a constant value indicating a radius of a sphere having the estimated first central points,
n is a predetermined integer, and
$1 \leq i \leq n$.

The geomagnetic sensor calibration method may further include calibrating central points by using a formula:

$$\hat{M}_b = M_b - M_0 = \begin{bmatrix} X - X_0 \\ Y - Y_0 \\ Z - Z_0 \end{bmatrix},$$

wherein $M_0 = [X_0, Y_0, Z_0]^T$ are coordinate values of the second central points estimated by the central point estimator, and
$M_b = [X, Y, Z]^T$ are output values of the geomagnetic sensor.

The geomagnetic sensor calibration method may further include calculating an average value and a standard deviation value of distances between a plurality of sampled geomagnetic coordinates and the estimated first central points, and determining whether calibration of the geomagnetic sensor is necessary based on whether at least one of the calculated average value and the standard deviation value exceeds a preset value.

The geomagnetic sensor calibration method may also include calculating a pitch angle and a roll angle of an electronic device, and calculating azimuth by using the at least one measured value of the Earth's magnetic field, the pitch angle, and the roll angle.

The controller may be a micro controller unit in the geomagnetic sensor calibration apparatus.

The geomagnetic sensor calibration apparatus may be a remote controller.

According to an aspect of another exemplary embodiment, there is provided a non-transitory computer readable medium which stores a program that is executed by a computer to perform the geomagnetic sensor calibration method.

BRIEF DESCRIPTION OF THE DRAWINGS

The above and/or other aspects will be more apparent by describing certain exemplary embodiments with reference to the accompanying drawings, in which.

DETAILED DESCRIPTION OF EXEMPLARY EMBODIMENTS

Figure 1:
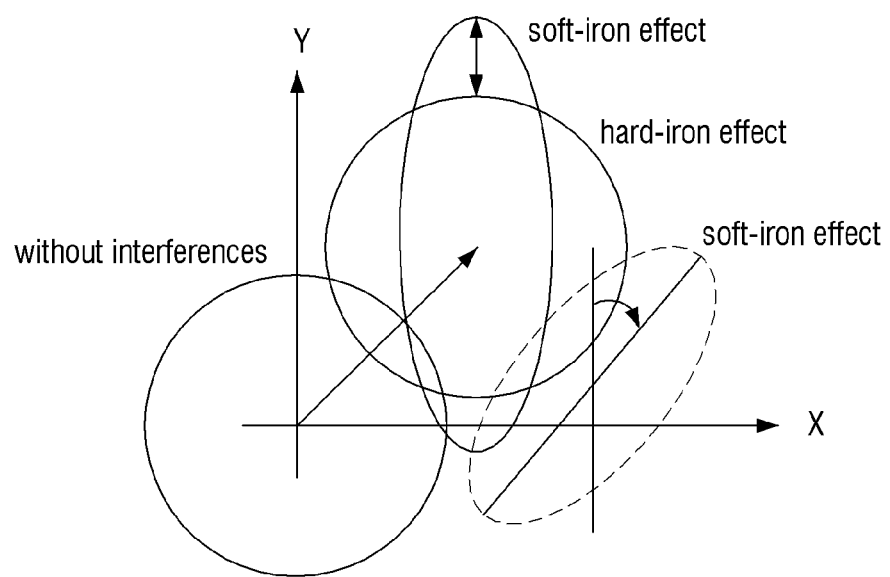
FIG. 1 is an illustration showing magnetic distortion on dimensional coordinates.
Figure 2:
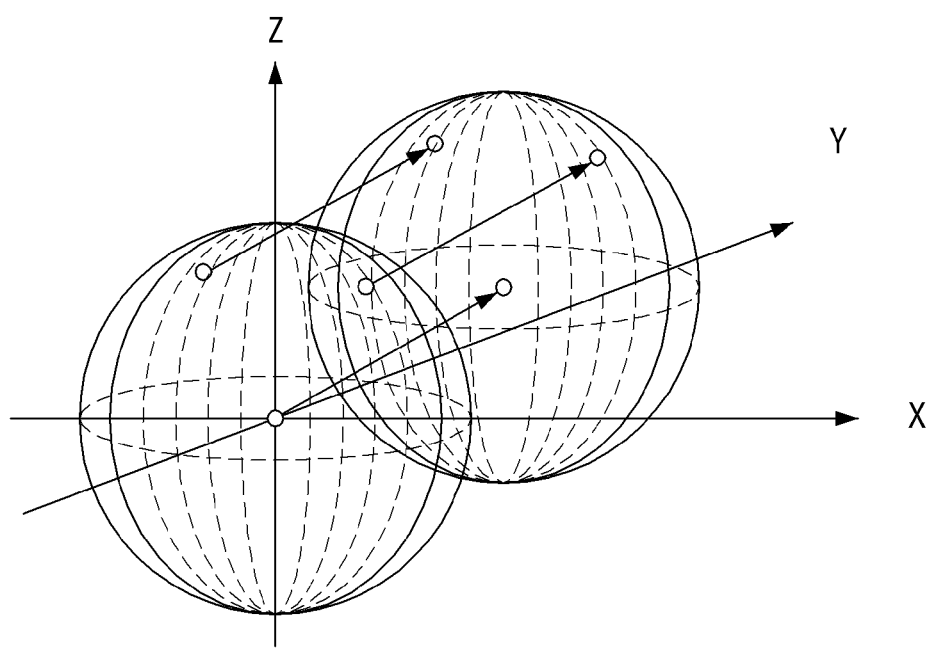
FIG. 2 is a diagram which illustrates effects by hard iron on three dimensional coordinates of X, Y, and Z.

Certain exemplary embodiments will now be described in greater detail with reference to the accompanying drawings.

In the following description, like drawing reference numerals are used for the same elements even in different drawings. The matters defined in the description, such as detailed construction and elements, are provided to assist in a comprehensive understanding of the exemplary embodiments. However, exemplary embodiments can be practiced without those specifically defined matters. Also, well-known functions or constructions are not described in detail since they would obscure the invention with unnecessary detail.

Figure 3:
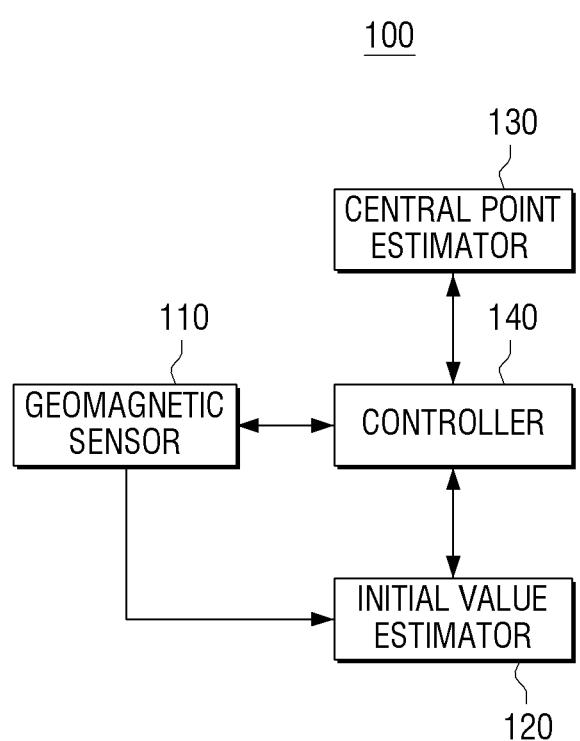
FIG. 3 is a block diagram of a geomagnetic sensor calibration apparatus according to an exemplary embodiment.
Figure 4:
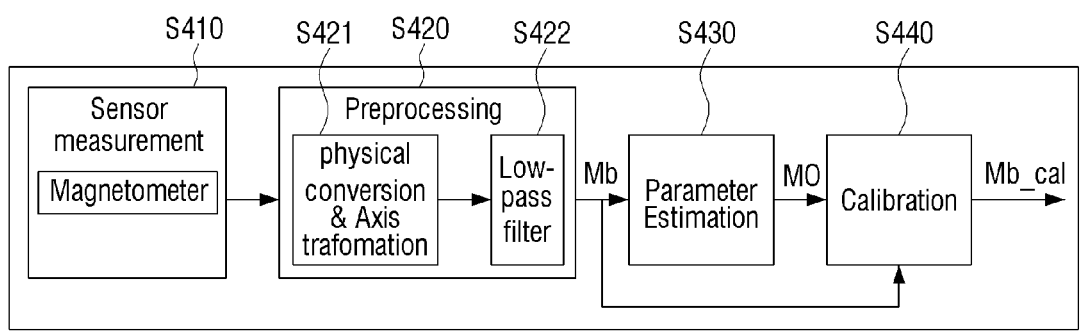
FIG. 4 is a block diagram describing operating process of a geomagnetic sensor calibration apparatus.
Figure 5:
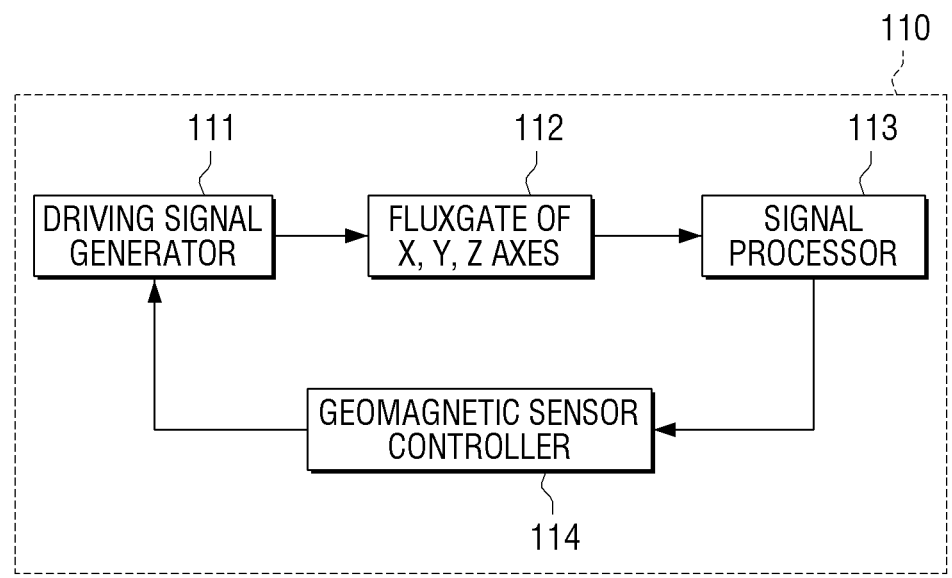
FIG. 5 is a block diagram of a three-axis geomagnetic sensor.

FIG. 3 is a block diagram of a geomagnetic sensor calibration apparatus 100 according to an exemplary embodiment, FIG. 4 is a block diagram describing operating process of the geomagnetic sensor calibration apparatus 100, and FIG. 5 is a block diagram of a three-axis geomagnetic sensor.

Referring to FIG. 3, the geomagnetic sensor calibration apparatus according to an exemplary embodiment includes a geomagnetic sensor 110, an initial value estimator 120, a central point estimator 130, and a controller 140.

The geomagnetic sensor 110 is configured to measure values of the Earth's magnetic field.

According to an exemplary embodiment, the geomagnetic sensor 110 may include a three-axis geomagnetic sensor (not illustrated). The three-axis geomagnetic sensor calculates output values corresponding to surrounding magnetic field by using a fluxgate of X, Y, and Z axes which are orthogonally crossed, at 5410. Output values from the three-axis geomagnetic sensor are values normalized by mapping output values from the fluxgate of X, Y, and Z axes in each within a preset range, for example, from −1 to 1. Offset values and scale values used in normalization are previously established and stored in an internal memory (not illustrated).

Referring to FIG. 5, the three-axis geomagnetic sensor includes a driving signal generator 111, a fluxgate of X, Y, and Z axes 112, a signal processor 113, and a geomagnetic sensor controller 114.

The driving signal generator 111 performs a role of generating driving signals to drive the fluxgate of X, Y, and Z axes and output the driving signals. The driving signals may be provided in pulse, or inversion pulse form.

The fluxgate of X, Y, and Z axes 112 includes three cores crossed orthogonally to each other and coils wound around the cores. Therefore, when driving signals are delivered to each coil, the coils are energized and provide output values corresponding to surrounding magnetic field.

The signal processor 113 performs various processes such as amplifying the output values provided from the fluxgate of X, Y, and Z axes at S421, converting the amplified output values from analog values to digital values (A/D), and providing the converted amplified output values to the geomagnetic sensor controller.

The geomagnetic sensor controller 114 normalizes the output values of the signal processor by using preset offset values and scale values and output the normalized values externally. Normalization may be performed through the following mathematical formula:

$$Xf_{norm} = \frac{(Xf - Xf_{bias})}{Xf_{sf}} * a \quad \text{[Formula 3]}$$

$$Yf_{norm} = \frac{(Yf - Yf_{bias})}{Yf_{sf}} * a$$

$$Zf_{norm} = \frac{(Zf - Zf_{bias})}{Zf_{sf}} * a$$

$$Xf_{offset} = \frac{Xf_{max} + Xf_{min}}{2}, Xf_{sf} = \frac{Xf_{max} - Xf_{min}}{2}$$

$$Yf_{offset} = \frac{Yf_{max} + Yf_{min}}{2}, Yf_{sf} = \frac{Yf_{max} - Yf_{min}}{2}$$

$$Zf_{offset} = \frac{Zf_{max} + Zf_{min}}{2}, Zf_{sf} = \frac{Zf_{max} - Zf_{min}}{2}$$

According to Formula 3, Xf, Yf, Zf are three-axis values of the signal processor, $Xf_{norm}$, $Yf_{norm}$, $Zf_{norm}$ are three-axis normalizing values, $Xf_{max}$ and $Xf_{min}$ are maximum value and minimum value of Xf, respectively, $Yf_{max}$ and $Yf_{min}$ are maximum value and minimum value of Yf, respectively, $Zf_{max}$ and $Zf_{min}$ are maximum value and minimum value of Zf, respectively, and a is a constant value. α having a value smaller than 1 is used so that output values of the signal processor can be mapped within ±1 range on horizontal axis. α can be established by using a representative dip value of area where the azimuth calibration device is used. For example, if the azimuth calibration device is used in South Korea where the dip value is about 53°, α may be cos 53°≈0.6. $Xf_{max}$, $Xf_{min}$, $Yf_{max}$, $Yf_{min}$, $Zf_{max}$, and $Zf_{min}$ are established by previously measuring output values while rotating the azimuth calibration device at least once, and by selecting maximum and minimum values among the output values. Because established a, $Xf_{max}$, $Xf_{min}$, $Yf_{max}$, $Yf_{min}$, $Zf_{max}$, and $Zf_{min}$ values are stored in a memory (not illustrated) within the three-axis geomagnetic sensor or in an external memory (not illustrated), they can be used during normalization.

Although not illustrated in the drawings, converting sensor axes may be performed when need arises, at S421. In other words, converting axes of the three-axis geomagnetic sensor into axes defined from a viewpoint of an input device, may be performed.

Electrical noises and high frequency noises are removed through a low pass filter, at S422.

Figure 6:
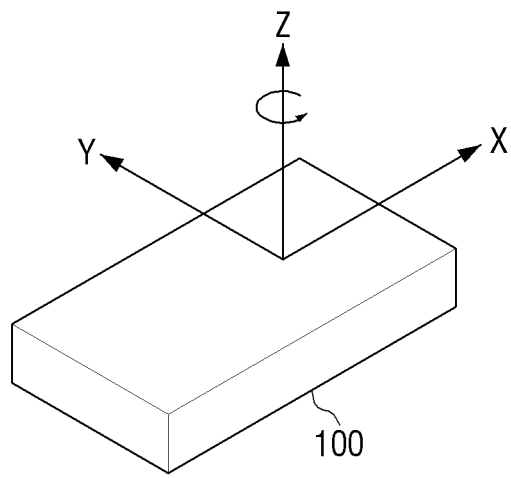
FIG. 6 is an illustration showing how a three-axis fluxgate is arranged.

FIG. 6 is an illustration showing how the three-axis fluxgate is arranged. Referring to FIG. 6, the X axis of the fluxgate within the three-axis geomagnetic sensor is mounted toward a direction of a front part of the geomagnetic sensor calibration apparatus 100 including the fluxgate, the Y axis of the fluxgate is mounted toward a direction of a side part, and X and Y axes of the fluxgate are mounted to be crossed orthogonally on a plane where the geomagnetic sensor calibration apparatus 100 is disposed. The Z axis of the fluxgate is mounted toward a direction orthogonal to the plane where the geomagnetic sensor calibration apparatus 100 is disposed.

The initial value estimator 120 estimates first central points from the measured values of the Earth's magnetic field by using a first linear function. A sphere equation having central points $(X_0, Y_0, Z_0)$ and radius (r) is the same as Formula 2 described above. Accordingly, any point on the sphere can be interpreted as satisfying the function. Regarding three-axis geomagnetic sensor data that satisfy conditions defined in Formula 1, when output values are $(X_i, Y_i, Z_i)$, relations between the output values and the radius $(r_i)$ may be expressed as:

$$r_i = \sqrt{(X_i - X_0)^2 + (Y_i - Y_0)^2 + (Z_i - Z_0)^2},$$

When a function f is defined as $f = r_i^2 - r^2$ for the initial value estimator, the function f can be organized according to the following mathematical formula:

$$f = (X_i - X_0)^2 + (Y_i - Y_0)^2 + (Z_i - Z_0)^2 - r^2 = -2(X_i X_0 + Y_i Y_0 + Z_i Z_0) + p + (X_i^2 + Y_i^2 + Z_i^2), \quad \text{[Formula 4]}$$

wherein $\rho = X_0^2 + Y_0^2 + Z_0^2 - r^2$. Variable p is used to linearize the function f.

The following Formula (Formula 5) may be expressed when the function of Formula 4 is expanded to n number of data classes:

$$AP - B = F, \quad \text{[Formula 5]}$$

wherein $$A = \begin{bmatrix} -2X_1 & -2Y_1 & -2Z_1 & 1 \\ -2X_2 & -2Y_2 & -2Z_2 & 1 \\ \cdots & \cdots & \cdots & \cdots \\ -2X_n & -2Y_n & -2Z_n & 1 \end{bmatrix}, P = \begin{bmatrix} X_0 \\ Y_0 \\ Z_0 \\ p \end{bmatrix},$$

$$B = \begin{bmatrix} X_1^2 + Y_1^2 + Z_1^2 \\ X_2^2 + Y_2^2 + Z_2^2 \\ \cdots \\ X_n^2 + Y_n^2 + Z_n^2 \end{bmatrix}, F = \begin{bmatrix} f_1 \\ f_2 \\ \cdots \\ f_n \end{bmatrix}$$

When F=0 is defined for the least square solution, AP−B=0 in Formula 5 and $P = (A^T A)^{-1} A^T B$. Examples of the least squre fitting method are described in detail in the article, "AN ALGORITHM FOR FITTING OF SPHERES" by Ik-Sung Kim, J. Korea Soc. Math. Educ. Ser. B: Pure Appl.

Math. Volume 11, Number 1 (February 2004), Pages 37-49, hereby incorporated by reference.

$X_0$, $Y_0$, $Z_0$, and $\rho$ are calculated with the above P value, and r is calculated according to definition of $\rho$, $\rho = X_0^2 + Y_0^2 + Z_0^2 - r^2$. As described in more detail below, when the calculated initial value r is $r_0$, the central point estimator 130 calculates second central points by using the initial values, $X_0$, $Y_0$, $Z_0$, and $r_0$ which are obtained by the above.

The central point estimator 130 estimates second central points by using a second linear function and the above estimated initial values. After estimating the initial values, final estimating central points is performed based on the estimated initial values, at S430.

In order to search final central points from the estimated initial values, $X_0$, $Y_0$, $Z_0$, and $r_0$, a Gauss-Newton algorithm is used. The Gauss-Newton algorithm is a method to search solutions by linearizing a non-linear function and repeating the processes. In one exemplary embodiment, a minimized function is established to be $d_i = r_i - r_0$ so as to apply a Gauss-Newton algorithm. Herein, $r_i = \sqrt{(X_i - X_0)^2 + (Y_i - Y_0)^2 + (Z_i - Z_0)^2}$.

A Jacobian matrix (J) regarding the minimized function $d_i$ is calculated with a following equation:

$$J = \begin{bmatrix} \frac{\partial d_1}{\partial X_0} & \frac{\partial d_1}{\partial Y_0} & \frac{\partial d_1}{\partial Z_0} & \frac{\partial d_1}{\partial r_0} \\ \frac{\partial d_2}{\partial X_0} & \frac{\partial d_2}{\partial Y_0} & \frac{\partial d_2}{\partial Z_0} & \frac{\partial d_2}{\partial r_0} \\ \cdots & \cdots & \cdots & \cdots \\ \frac{\partial d_n}{\partial X_0} & \frac{\partial d_n}{\partial Y_0} & \frac{\partial d_n}{\partial Z_0} & \frac{\partial d_n}{\partial r_0} \end{bmatrix} = \quad \text{[Formula 6]}$$

$$\begin{bmatrix} \frac{-(X_1 - X_0)}{r_1} & \frac{-(Y_1 - Y_0)}{r_1} & \frac{-(Z_1 - Z_0)}{r_1} & -1 \\ \frac{-(X_2 - X_0)}{r_2} & \frac{-(Y_2 - Y_0)}{r_2} & \frac{-(Z_2 - Z_0)}{r_2} & -1 \\ \cdots & \cdots & \cdots & \cdots \\ \frac{-(X_n - X_0)}{r_n} & \frac{-(Y_n - Y_0)}{r_n} & \frac{-(Z_n - Z_0)}{r_n} & -1 \end{bmatrix}$$

When the linearized equation $JP = -d$ is solved with the least square method, $P = (J^T J)^{-1} J^T (-d)$. Herein, P and d are as follows:

$$P = \begin{bmatrix} p_{X_0} \\ p_{Y_0} \\ p_{Z_0} \\ p_{r_0} \end{bmatrix}, \quad d = \begin{bmatrix} r_1 - r_0 \\ r_2 - r_0 \\ \cdots \\ r_n - r_0 \end{bmatrix} \quad \text{[Formula 7]}$$

Updating parameters is performed by using previous values and P value.

$$X_0 = X_0 + p_{X_0}$$

$$Y_0 = Y_0 + p_{Y_0}$$

$$Z_0 = Z_0 + p_{Z_0}$$

$$r_0 = r_0 + p_{r_0} \quad \text{[Formula 8]}$$

Final central points $(X_0, Y_0, Z_0)$ are calculated by repeating formulae 6 to 8 until it satisfies convergence conditions. Convergence conditions are as follows. Herein, $\epsilon_1$ is a constant value previously established.

$$\|P\| = \sqrt{p_{X_0}^2 + p_{Y_0}^2 + p_{Z_0}^2 + p_{r_0}^2} < \epsilon_1 \quad \text{[Formula 9]}$$

The following describes the controller 140. The controller 140 determines whether calibrating the geomagnetic sensor 110 is necessary based on the first estimated central points. When calibrating is determined to be necessary, the controller 140 controls estimating the second central points.

The controller 140 calculates distance of the coordinates of X, Y, and Z sensed by the geomagnetic sensor from Formula 1 based on the obtained first central points, $X_0$, $Y_0$, $Z_0$. When the distance is determined to be more than allowable range $\alpha$, the controller 140 determines that the geomagnetic values have distortion and starts calibrating. When the distance is within allowable range $\alpha$, the controller 140 determines that errors of the geomagnetic sensor are not detected. However, the above process may be performed per preset time interval, in which case calibrating starts when the obtained distance exceeds allowable range $\alpha$ for the preset time interval.

When the offset values are distorted, the controller 140 controls the geomagnetic sensor 110 to sample a plurality of geomagnetic sensor values. The geomagnetic sensor 110 outputs a plurality of sampled values by repeatedly sampling values outputted from the three-axis geomagnetic sensor (not illustrated). The sampling process may be performed for certain time. Thus, when a certain time after first sampling passes, first sampling is newly performed and the previous first sampled values are deleted. The number of samplings may be previously established such that the sampling stops after the previously established value.

The distances between sampled values may be more than a specific distance so as to precisely examine whether the offset values are distorted. Therefore, when values sampled at an i-th number are Si, distance between S1 and S2 is calculated and compared with a preset critical distance when S2 is sampled. When the distance is within a critical distance, S2 is newly sampled. When the distance is not within a critical distance, S2 is selected and S3 is sampled. When S3 is sampled, distance between 51 and S3 and distance between S2 and S3 are consecutively calculated, and the calculated distance of each of them compared with a critical distance. When any one of them is within a critical distance, S3 is newly sampled. When both of them are out of the critical distance, S3 is selected. According to the same method, S1~SN are outputted by sampling until the sampling number that a user establishes (N number).

The controller 140 calculates distance from each of sampled S1~SN to the offset values calculated above in the geomagnetic sensor 110 and calculates an average value and a standard deviation value of the distances. When any one of the average value and the standard deviation value is more than a predefined value, it determines that distortion has occurred. However, when both of the average value and the standard deviation value are less than a preset value, calibrating stops because distortion is determined to be not detected. When distortion of the offset values is determined to be detected, the controller 140 controls the central point estimator 130 to estimate the above second central points.

The controller 140 calibrates geomagnetic sensor values by using the central points, $M_0 = [X_0, Y_0, Z_0]^T$, which are calculated in the central point estimator, at S440. Output values of the three-axis geomagnetic sensor which are orthogonal to each other are $M_b = [X, Y, Z]^T$, and geomagnetic sensor values are calibrated by using a following formula:

$$\hat{M}_b = M_b - M_0 = \begin{bmatrix} X - X_0 \\ Y - Y_0 \\ Z - Z_0 \end{bmatrix} \quad \text{[Formula 10]}$$

Calculation errors are minimal even when $r_0$ is fixed to be constant from the initial estimated values, $X_0$, $Y_0$, $Z_0$, and $r_0$. When a radius is fixed, calculating speed is faster because algorithm calculations to estimate central points become simpler. Accordingly, a micro controller unit (MCU), which has limited calculating performance, can be used. For example, it is possible to fix a radius value (r) as magnitude of the Earth's magnetic field in calculating to search offset values of the three-axis geomagnetic sensor. Magnitude of the Earth's magnetic field is different according to latitude (usually 0.25~0.65 Gauss); however, it is averagely about 0.5 Gauss. Therefore, magnitude of the Earth's magnetic field may be fixed based on 0.5 Gauss, and central points, X0, Y0, Z0, may be calculated by applying a Gauss-Newton algorithm.

The above described Jacobian matrix can be obtained as follows.

A Jacobian matrix regarding the minimized function, $d_i = r_i - \bar{r}$, is calculated in the following mathematical formula. Herein, $$r_i = \sqrt{(X_i - X_0)^2 + (Y_i - Y_0)^2 + (Z_i - Z_0)^2},$$

$$J = \begin{bmatrix} \frac{\partial d_1}{\partial X_0} & \frac{\partial d_1}{\partial Y_0} & \frac{\partial d_1}{\partial Z_0} \\ \frac{\partial d_2}{\partial X_0} & \frac{\partial d_2}{\partial Y_0} & \frac{\partial d_2}{\partial Z_0} \\ \cdots & \cdots & \cdots \\ \frac{\partial d_n}{\partial X_0} & \frac{\partial d_n}{\partial Y_0} & \frac{\partial d_n}{\partial Z_0} \end{bmatrix} = \quad \text{[Formula 11]}$$

$$\begin{bmatrix} \frac{-(X_1 - X_0)}{r_1} & \frac{-(Y_1 - Y_0)}{r_1} & \frac{-(Z_1 - Z_0)}{r_1} \\ \frac{-(X_2 - X_0)}{r_2} & \frac{-(Y_2 - Y_0)}{r_2} & \frac{-(Z_2 - Z_0)}{r_2} \\ \cdots & \cdots & \cdots \\ \frac{-(X_n - X_0)}{r_n} & \frac{-(Y_n - Y_0)}{r_n} & \frac{-(Z_n - Z_0)}{r_n} \end{bmatrix}$$

When the linear equation, $JP = -d$, is solved with the least square method, $P = (J^T J)^{-1} J^T (-d)$. Herein, P and d are as follows:

$$P = \begin{bmatrix} p_{x_0} \\ p_{y_0} \\ p_{z_0} \end{bmatrix}, d = \begin{bmatrix} r_1 - \bar{r} \\ r_2 - \bar{r} \\ \cdots \\ r_n - \bar{r} \end{bmatrix} \quad \text{[Formula 12]}$$

Updating parameters is performed by using P value and previous values.

$$X_0 = X_0 - p_{x_0}$$

$$Y_0 = Y_0 - p_{y_0}$$

$$Z_0 = Z_0 - p_{z_0} \quad \text{[Formula 13]}$$

Final central points, X0, Y0, Z0, are calculated by repeating the above processes until it satisfies convergence conditions. Convergence conditions are expressed in a following mathematical formula. $\epsilon_2$ is a previously established constant value.

$$\|P\| = \sqrt{p_{x_0}^2 + p_{y_0}^2 + p_{z_0}^2} < \epsilon_2 \quad \text{[Formula 14]}$$

The geomagnetic sensor calibration apparatus 100 described above may further include a storage (not illustrated).

The storage (not illustrated) stores geomagnetic values sensed by the geomagnetic sensor 110, initial estimated values X0, Y0, Z0, and r0 calculated by the initial value estimator 120, a standard deviation value and an average value of distances between the sensed geomagnetic values and offset values which are calculated by the controller 140, other data necessary for estimating central points, and result values. The storage may be implemented as non-transitory readable recording medium.

Non-transitory readable medium indicates a medium which stores data semi-permanently and can be read by devices. For example, non-transitory readable medium may be CD, DVD, hard disk, Blu-ray disk, USB, memory card, or ROM.

When estimating central points is completed, the controller 140 calculates azimuth by using three-axis geomagnetic output values outputted from the three-axis geomagnetic sensor, a pitch angle and a roll angle calculated in a tilt angle calculator (not illustrated). Calculating azimuth may be performed by using a following mathematical formula:

$$\psi = \tan^{-1}\left( \frac{Y_{norm} * \cos\phi - Z_{norm} * \sin\phi}{X_{norm} * \cos\theta - Y_{norm} * \sin\theta * \sin\phi - Z_{norm} * \sin\theta * \cos\phi} \right) \quad \text{[Formula 15]}$$

wherein $\psi$ is azimuth, $X_{norm}$, $Y_{norm}$, and $Z_{norm}$ are three-axis geomagnetic output values which are normalized by using calibrated offset values in each, $\theta$ is a pitch angle, and $\phi$ is a roll angle. The controller 140 can calculate azimuth precisely because the values are normalized according to the offset values of which distortion is calibrated.

In the following, a method of calibrating errors of the geomagnetic sensor according to an exemplary embodiment is described.

Figure 7:
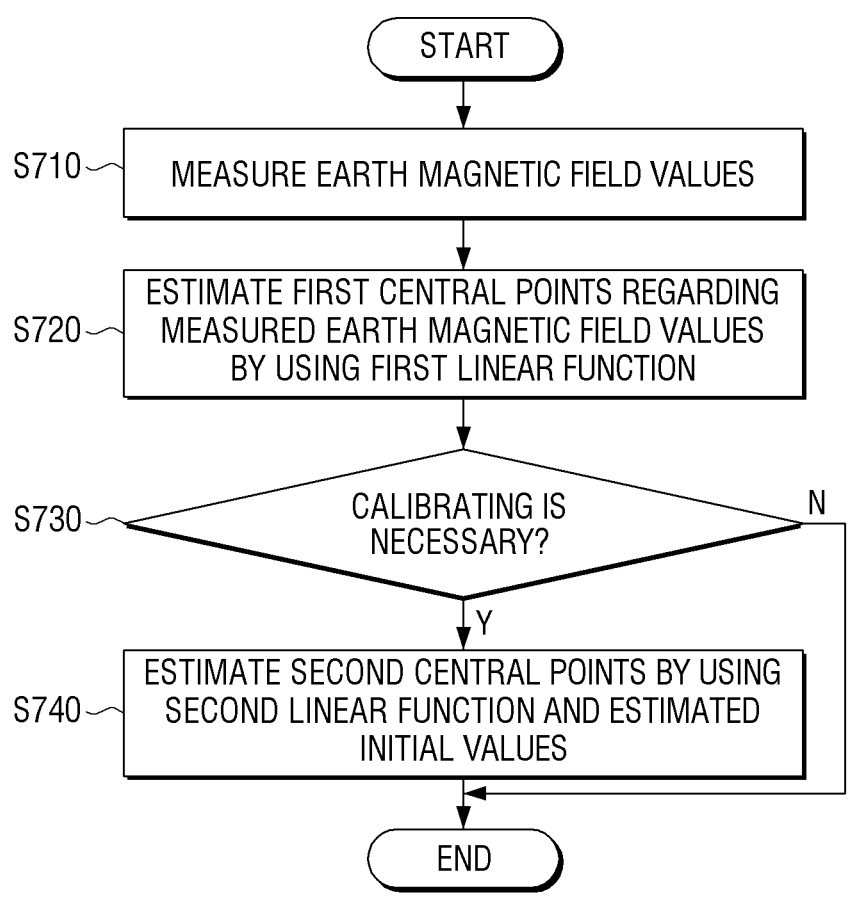
FIG. 7 is a flowchart of a geomagnetic sensor calibration method according to an exemplary embodiment.

FIG. 7 is a flowchart describing the geomagnetic sensor calibration method according to an exemplary embodiment.

Referring to FIG. 7, the geomagnetic sensor calibration method according to an exemplary embodiment includes measuring the geomagnetic field at operation S710, estimating first central points at operation S720, determining whether calibration is necessary at operation S730, and if calibration is determined to be necessary, estimating second central points at operation S740.

At operation S710, values of the Earth's magnetic field are measured. The three-axis geomagnetic sensor may be used to measure the Earth's magnetic field. Constitutions and operations of the three-axis geomagnetic sensor are previously described in exemplary embodiments and will not be further explained.

At operation S720, first central points of the measured values of the Earth's magnetic field are estimated by using the first linear function. Herein, the first linear function is a function which linearizes the function $$f = r_i^2 - r^2.$$

Herein, $$r_i = \sqrt{(X_i - X_0)^2 + (Y_i - Y_0)^2 + (Z_i - Z_0)^2},$$

$$(X - X_0)^2 + (Y - Y_0)^2 + (Z - Z_0)^2 = r^2,$$

$(X_i, Y_i, Z_i)$ are coordinate values which are sampled at an i-th number in the three-axis geomagnetic sensor, $(X_0, Y_0, Z_0)$ are the first central points, and $1 \le i \le n$.

Explanation of specific equations is previously described in exemplary embodiments of the geomagnetic sensor calibration apparatus and will not be further described.

At operation S730, necessity of calibration is determined. An average value and a standard deviation value of distances between a plurality of geomagnetic field sampling coordinates and the estimated first central points are obtained. Necessity of calibrating is determined according to whether at least one of the calculated average value and the standard deviation value exceeds a preset value. The specific method of determining whether distortion has occurred is previously described in exemplary embodiments of the geomagnetic sensor calibration apparatus and will not be further described.

At operation S740, second central points are estimated by using the second linear function and the above estimated first central points. The second linear function is a function which linearizes the minimized function $$d_i = r_i - r_0.$$

Herein, $$r_i = \sqrt{(X_i - X_0)^2 + (Y_i - Y_0)^2 + (Z_i - Z_0)^2},$$

$(X_i, Y_i, Z_i)$ are coordinate values which are sampled at an i-th number in the three-axis geomagnetic sensor, $(X_0, Y_0, Z_0)$ are the estimated first central points, $r_0$ is a radius of the sphere having the estimated first central points, and $1 \le i \le n$.

Explanation of specific equations is previously described in exemplary embodiments of the geomagnetic sensor calibration apparatus, which will not be further described.

Further, the first linear function is a function which linearizes the minimized function, $$d_i = r_i - \bar{r}.$$

Herein, $$r_i = \sqrt{(X_i - X_0)^2 + (Y_i - Y_0)^2 + (Z_i - Z_0)^2},$$

$(X_i, Y_i, Z_i)$ are coordinate values which are sampled at an i-th number in the three-axis geomagnetic sensor, $(X_0, Y_0, Z_0)$ are the estimated first central points, $\bar{r}$ is a constant value which indicates a radius of the sphere having the first central points, and $1 \le i \le n$.

When a radius is fixed, algorithm calculations to estimate central points are simpler and calculating speed becomes faster. Specific explanation of equations is previously described in exemplary embodiments of the geomagnetic sensor calibration apparatus and will not be further described.

Although not described in the drawings, the above calibration method of the geomagnetic sensor may further include calibrating central points by using the following mathematical formula:

$$\hat{M}_b = M_b - M_0 = \begin{bmatrix} X - X_0 \\ Y - Y_0 \\ Z - Z_0 \end{bmatrix},$$

wherein $M_0 = [X_0, Y_0, Z_0]^T$ are the above estimated second central points, and $M_b = [X, Y, Z]^T$ are output values of the three-axis geomagnetic sensor.

The geomagnetic sensor calibration method may further include calculating (not illustrated) a pitch angle and a roll angle of an electronic device, and calculating azimuth by using the measured values of the Earth's magnetic field, the pitch angle and the roll angle.

The geomagnetic sensor calibration method may be implemented as programs which include algorithms that can run on a computer including a processor, and the programs may be stored and provided in non-transitory computer readable medium.

Non-transitory computer readable medium indicate medium which store data semi-permanently and can be read by devices. Specifically, the above various applications or programs may be stored and provided in non-transitory readable medium, such as CD, DVD, hard disk, Blu-ray disk, USB, memory card, or ROM.

According to the various exemplary embodiments, initial central points of the sphere which models the sensed geomagnetic values are estimated by using linear functions in circumstances having effects by hard iron. Further, by estimating final central points with the estimated initial central points, calibration can be performed quickly and precisely.

Further, because the amount of calculations is reduced by fixing a radius value as constant, calibrating the geomagnetic sensor may be performed more quickly and efficiently.

The foregoing exemplary embodiments and advantages are merely exemplary and are not to be construed as limiting the present invention. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A geomagnetic sensor calibration apparatus comprising:
    a geomagnetic sensor configured to measure at least one value of Earth's magnetic field; and
    a processor configured to:
    estimate first central points from the at least one measured value of the Earth's magnetic field by using a first linear function,
    estimate second central points by using a second linear function and the estimated first central points,
    determine whether calibration of the geomagnetic sensor is necessary based on the estimated first central points, and control the central point estimator to estimate second central points based on a result of the determination, and
    calculate a mean value and a standard deviation value of distances between a plurality of sampling coordinates output from the geomagnetic sensor and the estimated first central points, and determine whether calibration of the geomagnetic sensor is necessary based on whether at least one of the calculated average value and standard deviation value exceeds a preset value.

2. The geomagnetic sensor calibration apparatus of claim 1, wherein the at least one value of the Earth's magnetic field is expressed with coordinates in an X, Y, and Z coordinate space.

3. The geomagnetic sensor calibration apparatus of claim 1, wherein the first linear function linearizes a function:

$$f = r_i^2 - r^2,$$

wherein $$r_i = \sqrt{(X_i - X_0)^2 + (Y_i - Y_0)^2 + (Z_i - Z_0)^2},$$

$$(X - X_0)^2 + (Y - Y_0)^2 + (Z - Z_0)^2 = r^2,$$

($X_i$, $Y_i$, $Z_i$) are coordinate values sampled at an i-th number of the geomagnetic sensor,
($X_0$, $Y_0$, $Z_0$) are the estimated first central points,
n is a predetermined integer, and
$1 \le i \le n$.

4. The geomagnetic sensor calibration apparatus of claim 1, wherein the second linear function linearizes a minimized function:

$$d_i = r_i - r_0,$$

wherein $$r_i = \sqrt{(X_i - X_0)^2 + (Y_i - Y_0)^2 + (Z_i - Z_0)^2},$$

($X_i$, $Y_i$, $Z_i$) are coordinate values sampled at an i-th number of the geomagnetic sensor,
($X_0$, $Y_0$, $Z_0$) are the estimated first central points,
$r_0$ is a radius of a sphere having the estimated first central points,
n is a predetermined integer, and
$1 \le i \le n$.

5. The geomagnetic sensor calibration apparatus of claim 1, wherein the first linear function linearizes a minimized function:

$$d_i = r_i - \bar{r},$$

wherein $$r_i = \sqrt{(X_i - X_0)^2 + (Y_i - Y_0)^2 + (Z_i - Z_0)^2},$$

($X_i$, $Y_i$, $Z_i$) are coordinate values sampled at an i-th number of the geomagnetic sensor,
($X_0$, $Y_0$, $Z_0$) are the estimated first central points,
$\bar{r}$ is a constant value indicating a radius of a sphere having the estimated first central points,
n is a predetermined integer, and
$1 \le i \le n$.

6. The geomagnectic sensor calibration apparatus of claim 1, wherein the processor is further configured to calibrate central points by using a formula:

$$\hat{M}_b = M_b - M_0 = \begin{bmatrix} X - X_0 \\ Y - Y_0 \\ Z - Z_0 \end{bmatrix},$$

wherein $M_0 = [X_0, Y_0, Z_0]^T$ are coordinate values indicating central points estimated by the central point estimator, and
$M_b = [X, Y, Z]^T$ are output values of the geomagnetic sensor.

7. The geomagnetic sensor calibration apparatus of claim 1, wherein the geomagnetic sensor comprises:

a fluxgate of X, Y, and Z axes which are arranged orthogonally to each other;
a driving signal generator configured to provide driving signals to the fluxgate of X, Y, and Z axes;
a signal processor configured to, when the fluxgate of X, Y, and Z axes is driven by the driving signals and outputs electrical signals corresponding to surrounding magnetic field, convert the electrical signals to digital signals and output the digital signals; and
a geomagnetic sensor controller configured to perform normalization to map output values of the signal processor within a certain range by using offset values and preset scale values, and output normalized three-axis output values.

8. The geomagnetic sensor calibration apparatus of claim 1, wherein the processor is further configured to calculate a pitch angle and a roll angle of the geomagnetic sensor calibration apparatus, and calculate azimuth by using the at least one measured value of the Earth's magnetic field, the pitch angle, and the roll angle.

9. The geomagnetic sensor calibration apparatus in claim 1, wherein the geomagnetic sensor calibration apparatus comprises a remote controller.

10. A geomagnetic sensor calibration method comprising:
measuring at least one value of Earth's magnetic field;
estimating first central points from the at least one measured value of the Earth's magnetic field by using a first linear function;
estimating second central points by using a second linear function and the estimated first central points;
calculating an average value and a standard deviation value of distances between a plurality of sampled geomagnetic coordinates and the estimated first central points; and
determining whether calibration of the geomagnetic sensor is necessary based on whether at least one of the calculated average value and the standard deviation value exceeds a preset value.

11. The geomagnetic sensor calibration method of claim 10, wherein the at least one measured value of the Earth's magnetic field is expressed with coordinates in an X, Y, and Z coordinate space.

12. The geomagnetic sensor calibration method of claim 10, wherein the first linear function linearizes a function:

$$f = r_i^2 - r^2,$$

wherein $$r_i = \sqrt{(X_i - X_0)^2 + (Y_i - Y_0)^2 + (Z_i - Z_0)^2},$$

$$(X - X_0)^2 + (Y - Y_0)^2 + (Z - Z_0)^2 = r^2,$$

($X_i$, $Y_i$, $Z_i$) are coordinate values sampled at an i-th number of the geomagnetic sensor,
($X_0$, $Y_0$, $Z_0$) are the estimated first central points,
n is a predetermined integer, and
$1 \le i \le n$.

13. The geomagnetic sensor calibration method of claim 10, wherein the second linear function linearizes a minimized function:

$$d_i = r_i - r_0,$$

wherein $$r_i = \sqrt{(X_i - X_0)^2 + (Y_i - Y_0)^2 + (Z_i - Z_0)^2},$$

($X_i$, $Y_i$, $Z_i$) are coordinate values sampled at an i-th number of the geomagnetic sensor, ($X_0$, $Y_0$, $Z_0$) are the estimated first central points, $r_0$ is a radius of a sphere having the estimated first central points, n is a predetermined integer, and $1 \leq i \leq n$.

14. The geomagnetic sensor calibration method of claim 10, wherein the first linear function linearizes a minimized function:

$$d_i = r_i - \bar{r},$$

wherein $$r_i = \sqrt{(X_i-X_0)^2+(Y_i-Y_0)^2+(Z_i-Z_0)^2},$$

($X_i$, $Y_i$, $Z_i$) are coordinate values sampled at an i-th number of the geomagnetic sensor, ($X_0$, $Y_0$, $Z_0$) are the estimated first central points, $\bar{r}$ is a constant value indicating a radius of a sphere having the estimated first central points, n is a predetermined integer, and $1 \leq i \leq n$.

15. The geomagnetic sensor calibration method of claim 10, further comprising:

calibrating central points by using a formula:

$$\hat{M}_b = M_b - M_0 = \begin{bmatrix} X - X_0 \\ Y - Y_0 \\ Z - Z_0 \end{bmatrix},$$

wherein $M_0 = [X_0, Y_0, Z_0]^T$ are coordinate values of the second central points estimated by the central point estimator, and $M_b = [X, Y, Z]^T$ are output values of the geomagnetic sensor.

16. The geomagnetic sensor calibration method of claim 10, further comprising:

calculating a pitch angle and a roll angle of an electronic device; and calculating azimuth by using the at least one measured value of the Earth's magnetic field, the pitch angle, and the roll angle.

17. A non-transitory computer readable medium which stores a program that is executed by a computer to perform the geomagnetic sensor calibration method of claim 10.

* * * * *